(12) United States Patent
Hah

(10) Patent No.: US 9,990,968 B2
(45) Date of Patent: Jun. 5, 2018

(54) CONTROL CIRCUIT AND MEMORY DEVICE HAVING THE SAME

(71) Applicant: SK hynix Inc., Incheon-si, Gyeonggi-do (KR)

(72) Inventor: Beom Seok Hah, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/290,145

(22) Filed: Oct. 11, 2016

(65) Prior Publication Data

US 2017/0323671 A1 Nov. 9, 2017

(30) Foreign Application Priority Data

May 9, 2016 (KR) .......... 10-2016-0056389

(51) Int. Cl.
  *G11C 11/34* (2006.01)
  *G11C 7/10* (2006.01)
  *G11C 7/22* (2006.01)

(52) U.S. Cl.
  CPC .......... *G11C 7/1063* (2013.01); *G11C 7/106* (2013.01); *G11C 7/222* (2013.01)

(58) Field of Classification Search
  CPC ........ G11C 7/1063; G11C 7/106; G11C 7/222
  USPC ...................................... 365/233.11
  See application file for complete search history.

(56) References Cited

U.S. PATENT DOCUMENTS

| | | | | |
|---|---|---|---|---|
| 5,144,581 | A | * | 9/1992 | Toda .......... G06F 5/01 346/134 |
| 2006/0025094 | A1 | * | 2/2006 | Ozawa .......... G06F 1/08 455/208 |
| 2010/0308874 | A1 | * | 12/2010 | Seki .......... H03K 23/667 327/115 |

FOREIGN PATENT DOCUMENTS

KR 100660546 B1 12/2006

* cited by examiner

*Primary Examiner* — Anthan Tran
(74) *Attorney, Agent, or Firm* — William Park & Associates Ltd.

(57) ABSTRACT

In an embodiment, a control circuit may include a command interface, a clock selection signal output circuit, and a clock generating circuit. The command interface may output a selection enable signal in response to a command. The clock selection signal output circuit may output, in response to the selection enable signal, a clock selection signal according to various sub-operations performed in a selected operation. The clock generating circuit may generate main clocks having different periods according the clock selection signal.

13 Claims, 5 Drawing Sheets

CONTROL CIRCUIT AND MEMORY DEVICE HAVING THE SAME

CROSS-REFERENCE TO RELATED APPLICATION

The present application claims priority under 35 U.S.C. § 119(a) to Korean patent application number 10-2016-0056389 filed on May 9, 2016 in the Korean Intellectual Property Office, the entire disclosure of which is incorporated herein by reference.

BACKGROUND

1. Technical Field

Various embodiments of the present disclosure generally relate to a control circuit and a memory device having the same, and more particularly, to a control circuit controlling operation timing and a memory device having the same.

2. Related Art

Memory devices may include memory blocks for storing data, peripheral circuits for performing a program, read, or erase operation on a selected memory block, and a control circuit for controlling the peripheral circuits.

The memory blocks may include a plurality of memory cells.

The peripheral circuits may include a voltage generator operating in response to control signals of the control circuit. The peripheral circuits may also include a row decoder, a column decoder, an input/output circuit, and a pass/fail determining circuit, etc.

The control circuit controls the peripheral circuits such that the peripheral circuits perform a program, read, or erasure operation in response to a command. The control circuit uses clock signals in controlling each operation according to a constant clock, and thus the control circuit has a limitation in varying an operation timing.

SUMMARY

In an embodiment of the present disclosure, a control circuit may include a command interface, a clock selection signal output circuit, and a clock generating circuit. The command interface may output a selection enable signal in response to a command. The clock selection signal output circuit may output, in response to the selection enable signal, a clock selection signal according to various sub-operations performed in a selected operation. The clock generating circuit may generate main clocks having different periods according the clock selection signal.

In an embodiment of the present disclosure, a memory device may include memory blocks, peripheral circuits, and a control circuit. The memory blocks may store data. The peripheral circuits may perform a program, read, or erasure operation on a memory block selected from among the memory blocks. The control circuit may adjust an operation time of each sub-operation performed in a selected operation while outputting control signals for controlling the peripheral circuits in response to a command.

DETAILED DESCRIPTION

Figure 1:
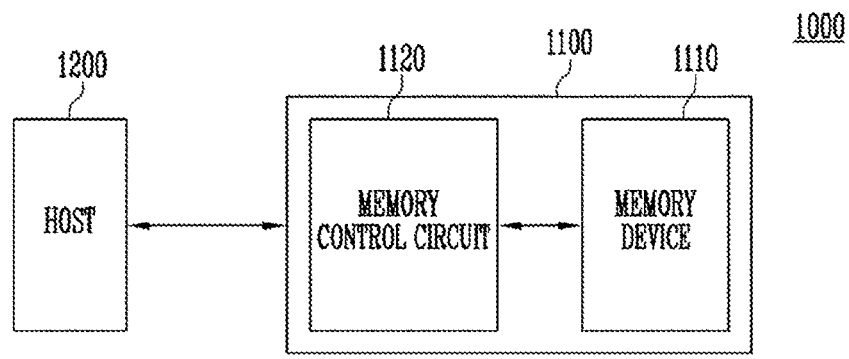
FIG. 1 is a diagram illustrating an example of a system including a memory device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component. In this specification, when an element is referred to as "comprising" or "including" a component, it does not preclude another component but may further include the other component unless the context clearly indicates otherwise.

FIG. 1 is a diagram illustrating an example of a system including a memory device according to an embodiment of the present disclosure.

Referring to FIG. 1, a memory system 1000 may include a storage device 1100 and a host 1200 for controlling the storage device 1100. The storage device 1100 may include a memory device 1110 for storing data and a memory control circuit 1120 for controlling the memory device 1110.

The host 1200 may communicate with the storage device 1100 through an interface protocol such as peripheral component interconnect-express (PCI-E), advanced technology attachment (ATA), serial ATA (SATA), parallel ATA (PATA), or serial attached SCSI (SAS). In addition, the interface protocol between the host 1200 and the storage device 1100 is not limited to the above-described examples, and may be one of other interface protocols such as a universal serial bus (USB), a multi-media card (MMC), an enhanced small disk interface (ESDI), or integrated drive electronics (IDE)

The memory control circuit 1120 may control an overall operation of the storage device 1100, and may also control data exchange between the host 1200 and the memory device 1110. For example, the memory control circuit 1120 may control the memory device 1110 such that a program, read, or erasure operation is performed according to a request from the host 1200.

According to embodiments, the memory device 1110 may include a Double Data Rate Synchronous Dynamic Random Access Memory (DDR SDRAM), Low Power Double Data Rate4 (LPDDR4), SDRAM, Graphics Double Data Rate (GDDR) SDRAM, Low Power DDR (LPDDR), Rambus Dynamic Random Access Memory (RDRAM), or FLASH Memory. Hereinafter, a description will be provided for a case where the memory device 1110 is a FLASH memory.

Figure 2:
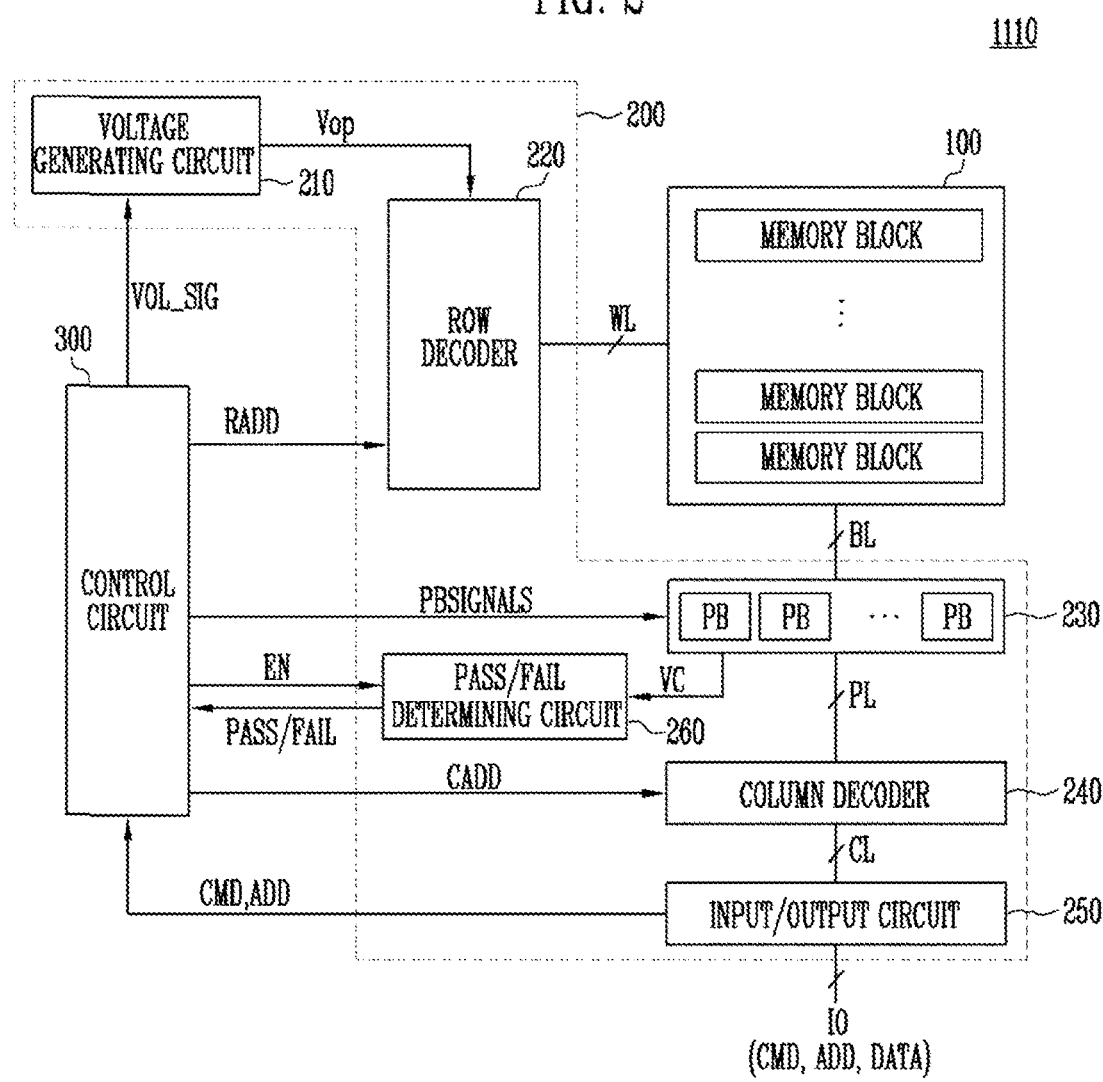
FIG. 2 is a diagram illustrating an example of the memory device of FIG. 1.

FIG. 2 is a diagram illustrating an example of the memory device of FIG. 1.

Referring to FIG. 2, the memory device 1110 may include a memory cell array 100, peripheral circuits 200, and a control circuit 300. Here, the peripheral circuits 200 may include circuitry that is used for program, read, and erase operations, and the control circuit 300 may control the peripheral circuits 200.

The memory cell array 100 may include a plurality of memory blocks. Each memory block may be coupled to a plurality of word lines WL and a plurality of bit lines BL. In an embodiment, each word line WL is coupled to one of the memory blocks, and each bit line BL may be coupled in common to a plurality of memory blocks.

The peripheral circuit 200 may include a voltage generating circuit 210, a row decoder 220, a page buffer circuit 230, a column decoder 240, an input/output circuit 250, and a pass/fail determining circuit 260.

In response to a voltage generation signal VOL_SIG, the voltage generating circuit 210 may generate various operating voltages Vop used for a program, read, or erase operation. For example, the voltage generating circuit 210 may generate various levels of program voltages, pass voltages, read voltages, and erase voltages in response to the voltage generation signal VOL_SIG.

The row decoder 220 may deliver the operating voltages Vop to local lines coupled to a selected memory block in response to a row address RADD. For example, the row decoder 220 may deliver the operating voltages Vop to the word lines WL coupled to the selected memory block. In addition, the row decoder 220 may also deliver the operating voltages Vop to one or more select lines coupled to the selected memory block.

The page buffer circuit 230 may include a plurality of page buffers PB coupled to the bit lines BL. The page buffers PB may transmit and receive data through the bit lines BL, and may temporarily store data delivered from the selected memory block.

The column decoder 240 may transmit and receive data to and from the page buffers PB through page lines PL in response to a column address CADD.

The input/output circuit 250 may deliver a command CMD and an address ADD received from a memory control circuit (e.g., the memory control circuit 1120 of FIG. 1) to the control circuit 300. The input/output circuit 250 may exchange data with the column decoder 240 coupled thereto through column lines CL.

The pass/fail determining circuit 260 may determine whether a certain operation has been completed, based on a voltage VC or a current received from the page buffer circuit 230, in response to an enable signal EN. The pass/fail determining circuit 260 may provide a pass signal PASS or a fail signal FAIL to the control circuit 300.

The control circuit 300 may output the voltage generation signal VOL_SIG, the row address RADD, a page buffer control signal PBSIGNALS, the enable signal EN, and the column address CADD in response to the command CMD and the address ADD to control the peripheral circuits 200.

In an embodiment, the control circuit 300 may change a clock period to adjust operation times of some sub-operations during the program, read, or erasure operation. For example, the program operation may include sub-operations such as a program setup sub-operation, a program sub-operation, a latch sub-operation, and a verify sub-operation, etc. The control circuit 300 may divide or group these sub-operations into a plurality of time sections according to their importance, and may control the peripheral circuits 200 using different clocks having different periods for different time sections. Here, the importance may mean how much operations (or sub-operations) performed during a certain time section can affect threshold voltage distributions of the memory cells. For example, the higher the importance, the more the threshold voltage of the memory cells can unwantedly shift. When it is assumed that a first clock is used for a high-importance time section, a second clock that has a shorter period than the first clock may be used in a time section having relatively lower importance. When the control circuit 300 controls the peripheral circuits 200 using the second clock having a shorter period, an operation time (e.g., the time it takes to perform an operation) may be shortened compared to when the first clock is used. An example of the control circuit 300 using different clocks will be discussed below.

Figure 3:
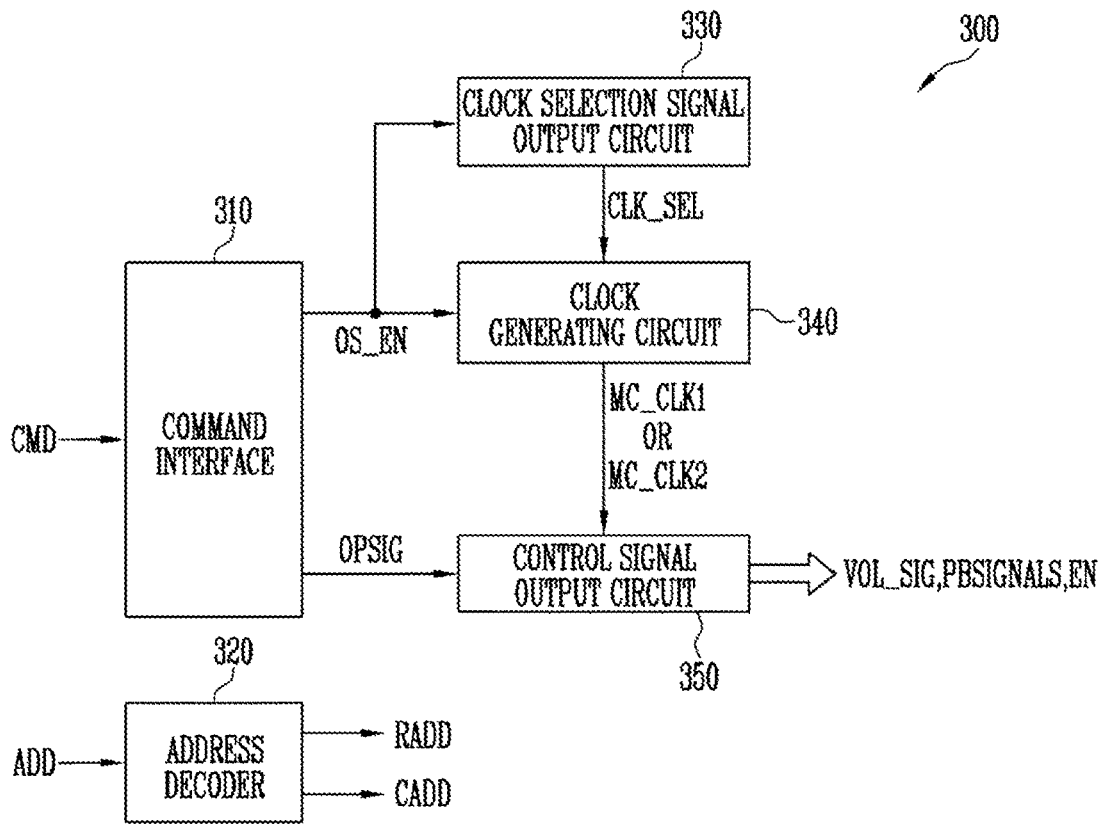
FIG. 3 is a diagram illustrating an example of a control circuit of FIG. 2.

FIG. 3 is a diagram illustrating an example of the control circuit of FIG. 2.

Referring to FIG. 3, the control circuit 300 may include a command interface 310, an address decoder 320, a clock selection signal output circuit 330, a clock generator 340, and a control signal output circuit 350.

The command interface 310 may output an operation signal OPSIG and a selection enable signal OS_EN in response to a command CMD received from the memory control circuit 1120 (of FIG. 1).

The address decoder 320 may output a row address RADD and a column address CADD in response to an address ADD received from the memory control circuit 1120 (of FIG. 1).

The clock selection signal output circuit 330 may output a clock selection signal CLK_SEL according to which operation or which sub-operation or which time section of the sub-operation is performed. Here, examples of the operation may include the program operation, the read operation, and the erasure operation. Each operation may include various sub-operations and time sections.

The program operation may include a voltage setup sub-operation, a program voltage application sub-operation, and a verify sub-operation, etc. Each sub-operation may be performed according to a set code or may be performed during a specific time period. Accordingly, the clock selection signal output circuit 330 may be composed of an operation code storing circuit or a timer.

If the clock selection signal output circuit 330 is composed of the operation code storing circuit, the clock selection signal output circuit 330 may output the clock selection signal CLK_SEL according to an operation code. If the clock selection signal output circuit 330 may be composed of the timer, the clock selection signal output circuit 330 may measure an operation time of a selected time section or a selected sub-operation, and may compare it to pre-stored time information to output the clock selection signal CLK_SEL. The clock selection signal SLK_SEL may be a signal having logic high or low level, or may be a code consisting of a plurality of bits. Hereinafter it is assumed that the clock selection signal CLK_SEL is a signal having logic high or low level.

The clock generator 340 may output a first main clock MC_CLK1 or a second main clock MC_CLK2 in response to the selection enable signal OS_EN and the clock signal CLK_SEL. Here, the periods of the first and second main clocks MC_CLK1 and MC_CLK2 are different from each other. For example, the second main clock MC_CLK2 may have a shorter period than the first main clock MC_CLK1.

The control signal output circuit 350 may output control signals VOL_SIG, PBSIGNALS, and EN for controlling the peripheral circuits 200 in response to the operation signal OPSIG and the first or second main clock MC_CLK1 or MC_CLK2. The control signals VOL_SIG, PBSIGNALS, and EN may be varied according to the first or second main clock MC_CLK1 or MC_CLK2.

Figure 4:
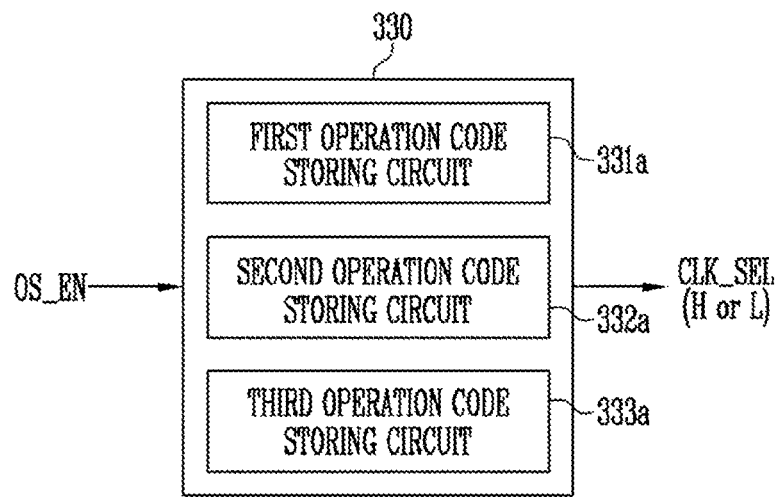
FIG. 4 is a diagram illustrating an example of a clock selection signal output circuit composed of operation code storing circuits.

FIG. 4 is a diagram illustrating an example of the clock selection signal output circuit composed of the operation code storing circuit.

Referring to FIG. 4, the clock selection signal output circuit 330 may include a plurality of operation code storing circuits 331a to 333a. Although FIG. 4 illustrates that the clock selection signal output unit 330 includes three operation code storing circuits (i.e., first to third operation code storing circuits 331a, 332a, and 333a), the number of operation code storing circuits is not limited thereto.

The first to third operation code storing circuits 331a to 333a may store various codes that are executed in various time sections or sub-operations (e.g., first to third operations). Here, the first to third operations are provided as examples, and thus various operations may be further included according to the memory device. For example, the first operation code storing circuit 331a may store various codes corresponding to the program operation, the second operation code storing circuit 332a may store various codes corresponding to the read operation, and the third operation code storing circuit 333a may store various codes corresponding to the erasure operation. The first operation code storing circuit 331a may store a first code corresponding to the program setup sub-operation, a second code corresponding to the program sub-operation, a third code corresponding to the latch sub-operation, and a fourth code corresponding to the verify sub-operation. The second operation code storing circuit 332a may store a fifth code corresponding to a read setup sub-operation, a sixth code corresponding to a sensing sub-operation, a seventh code corresponding to an evaluation sub-operation, and an eighth code corresponding to an output sub-operation. The third operation code storing circuit 333a may store a ninth code corresponding to an erasure setup sub-operation, a tenth code corresponding to an erasure sub-operation, an eleventh code corresponding to a latch sub-operation, and a twelfth code corresponding to a verify sub-operation. The above-described sub-operations are provided as examples, and thus the present disclosure is not limited thereto.

Among the above-described sub-operations, the latch sub-operation may have a low importance. On the other hand, the program, read, erase, and verify sub-operations may have high importances since they can directly influence the threshold voltage distributions of the memory cells.

When the selection enable signal OS_EN is a signal corresponding to the first operation, the clock selection signal output circuit 330 may check a code in each sub-operation included in the first operation while the first operation is being performed. The clock selection signal output circuit 330 may output a logic high signal or a logic low signal as the clock selection signal CLK_SEL according to the code. For example, if a code for a first sub-operation (or a first time section) indicates that the first sub-operation has a high importance and a code for a second sub-operation (or a second time section) indicates that the second sub-operation has a low importance, the clock selection signal output circuit 330 may output a logic-high clock selection signal according to the code corresponding to the first sub-operation (or the first time section) when the first sub-operation (or the first time section) included in the first operation starts, and may output a logic-low clock selection signal according to the code corresponding to the second sub-operation (or the second time section) when the second sub-operation (or the second time section) starts. In addition, if both the first and second sub-operations have high importances, the clock selection signal output circuit 330 may maintain the logic level of the clock selection signal CLK_SEL according to the code corresponding to each sub-operation.

Figure 5:
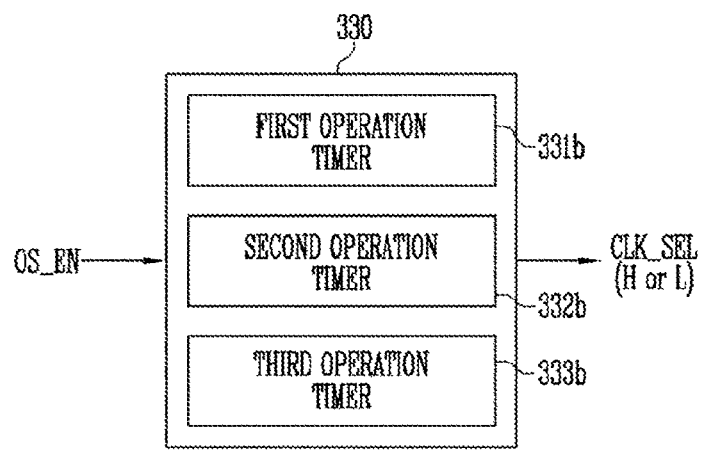
FIG. 5 is a diagram illustrating an example of a clock selection signal output circuit composed of timers.

FIG. 5 is a diagram illustrating an example of the clock selection signal output circuit composed of a timer.

Referring to FIG. 5, the clock selection signal output circuit 330 may include a plurality of operation timers. Although FIG. 5 illustrates that the clock selection signal output circuit 330 includes three operation timers (i.e., first to third operation timers 331b, 332b, and 333b), the number of operation timers is not limited thereto.

The first to third operation timers 331b to 333b may store time information about various time sections or sub-operations (e.g., the first to third operations). Here, the first to third operations are provided as examples, and thus the number of various operations may vary according to the memory device. For example, when the first operation is a program operation, the program operation may include a program setup sub-operation, a program sub-operation, a latch sub-operation, and a verify sub-operation, etc. When the second operation is a read operation, the read operation may include a read setup sub-operation, a sensing sub-operation, an evaluation sub-operation, and an output sub-operation, etc. When the third operation is an erasure operation, the erasure operation may include an erasure setup sub-operation, an erasure sub-operation, a latch sub-operation, and a verify sub-operation. Among the above-described sub-operations, the latch sub-operation may have a low importance. On the other hand, the program, read, erase, and verify sub-operations may have high importances since they can directly influence the threshold voltage distributions of the memory cells.

When the selection enable signal OS_EN is a signal corresponding to the first operation, the clock selection signal output circuit 330 may measure the amount of time it takes to complete each sub-operation (or time section) included in the first operation, while the first operation is performed. The clock selection signal output circuit 330 may output a logic high signal or a logic low signal as a clock selection signal CLK_SEL according to the code. For example, if the first operation includes a first sub-operation having a high importance and a second sub-operation having a low importance, the clock selection signal output circuit 330 may output a high-level clock selection signal CLK_SEL when the first sub-operation starts, and may output a low-level clock selection signal CLK_SEL if a time for the first sub-operation, which is set in the first operation timer 331b, has passed and a time for a second sub-operation is about to start. In addition, when sub-operations having relatively high importance are consecutively performed, the first to third operation timers 331b to 333b may group the sub-operations into one time section. In other words, if both the first and second sub-operations have high importances, the clock selection signal output circuit 330 may not change the high-level clock selection signal CLK_SEL to the logic low signal even when the first sub-operation is completed and the second sub-operation is about to start. Information for each sub-operation may be stored in the memory device in advance.

Figure 6:
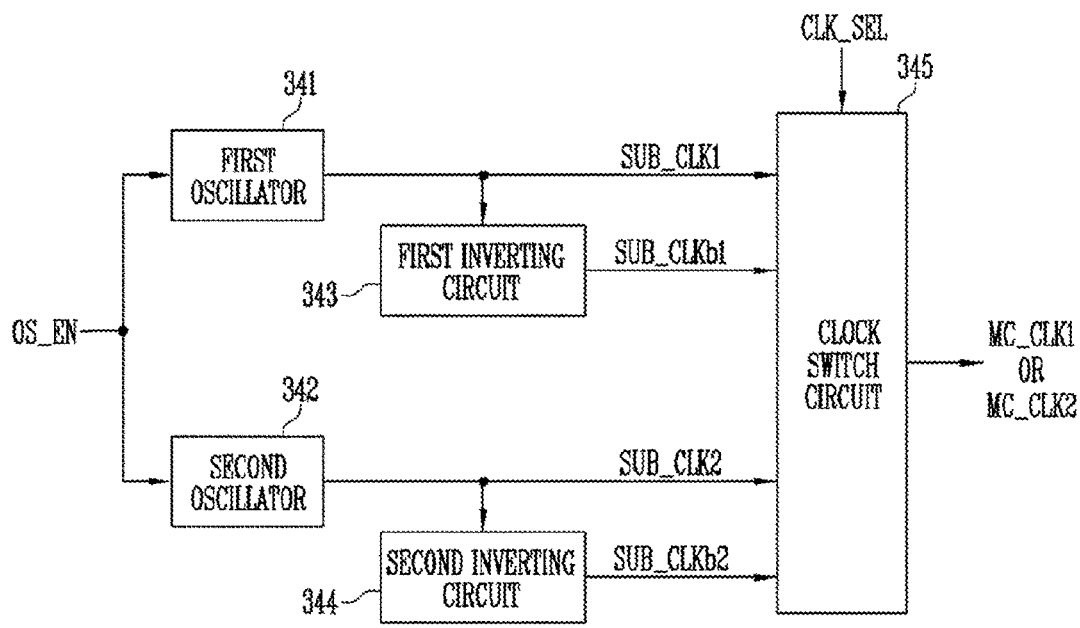
FIG. 6 is a diagram illustrating an example of a clock generating circuit.

FIG. 6 is diagram illustrating an example of the clock generating circuit.

Referring to FIG. 6, the clock generating circuit 340 may include first and second oscillators 341 and 342, first and second inverting circuits 343 and 344, and a clock switching circuit 345.

The first and second oscillators 341 and 342 may generate clocks having different periods in response to the selection enable signal OS_EN. For example, the first oscillator 342 may generate a first sub clock SUB_CLK1. The second oscillator 342 may also generate a second sub clock SUB_CLK2 having a shorter period than the first sub clock SUB_CLK1. Since the selection enable signal OS_EN is simultaneously applied to the first and second oscillators 341 and 342, the first and second oscillators 341 and 342 may simultaneously generate the first and second sub clocks SUB_CLK1 and SUB_CLK2.

The first and second inverting circuits 343 and 344 may invert the first and second sub clocks SUB_CLK1 and SUB_CLK2 to output first and second inverted sub clocks SUB_CLKb1 and SUB_CLKb2. For example, the first inverting circuit 343 may invert the first sub clock SUB_CLK1 to output the first inverted sub clock SUB_CLKb1, and the second inverting circuit 344 may invert the second sub clock SUB_CLK2 to output the second inverted sub clock SUB_CLKb2. The first inverted sub clock SUB_CLKb1 may have a different phase from and the same period as the first sub clock SUB_CLK1.

The clock switch circuit 345 may output the first main clock MC_CLK1 or the second main clock MC_CLK2 in response to the clock selection signal CLK_SEL. For example, in response to the clock selection signal CLK_SEL, the clock switch circuit 345 may output the first or second main clock MC_CLK1 or MC_CLK2 using a clock pair formed of the first sub clock SUB_CLK1 and the first inverted sub clock SUB_CLKb1 or a clock pair formed of the second sub clock SUB_CLK2 and the second inverted sub clock SUB_CLKb2 according to the clock selection signal CLK_SEL. In other words, the clock switch circuit 345 may output the first main clock SUB_CLK1 using the first sub clock SUB_CLK1 and the first inverted sub clock SUB_CLKb1, or the second main clock MC_CLK2 using the second sub clock SUB_CLK2 and the second inverted sub clock SUB_CLKb2.

Figure 7:
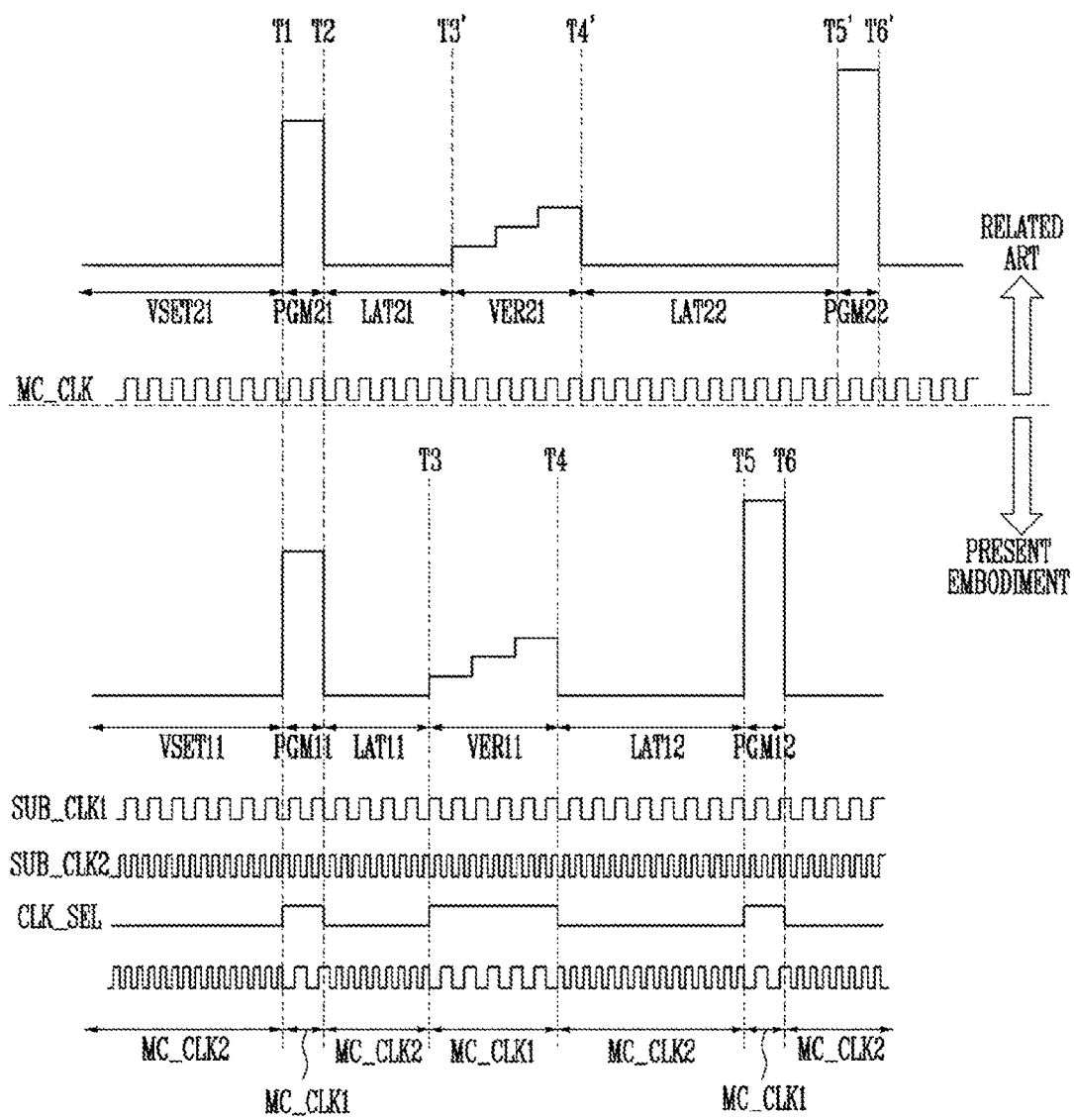
FIG. 7 is a diagram illustrating an example of a program operation according to an embodiment of the present disclosure.

FIG. 7 is a diagram illustrating an example of a program operation according to an embodiment of the present disclosure.

Referring to FIG. 7, the program operation may include a program setup sub-operation, a program sub-operation, a latch sub-operation, and a verify sub-operation. In the program setup sub-operation, a program voltage and a pass voltage may be set. In the program sub-operation, the program voltage may be applied to a selected word line to raise the threshold voltage of selected memory cells, and the pass voltage may be applied to unselected word lines. In the latch sub-operation, latches included in page buffers may be set up, and thus any operation influencing the threshold voltage of the memory cells is not performed. In the verify sub-operation, in order to determine the threshold voltage of the selected memory cells, a verify voltage may be applied to the selected word line and the pass voltage may be applied to the unselected word lines. Among the above-described sub-operations, the program sub-operation may possibly influence the threshold voltage of the memory cells, and the verify sub-operation that applies the verify voltage may have relatively higher importance than other sub-operations. Accordingly, in a sub-operation having a relatively low importance, an operation time may be shortened by using the second main clock MC_CLK2 having a shorter period, and in a sub-operation having a relatively high importance, the first main clock MC_CLK1 having a longer period is used to improve the reliability of the memory device.

Since a program loop is performed by using an incremental step pulse program (ISPP) method, a plurality of program sub-operations, latch sub-operations, and verify sub-operations may be performed during the program operation.

The program operation using the ISPP method may be performed as below.

In the program operation, the selection enable signal OS_EN (of FIG. 6) may be activated, and the first and second oscillators 341 and 342 (of FIG. 6) may output the first and second sub clocks SUB_CLK1 and SUB_CLK2.

If the program setup sub-operation VSET11 has a relatively low importance, the program setup sub-operation VSET11 may operate according to the second main clock MC_CLK2 output using the second sub clock SUB_CLK2 having a shorter period than the first sub clock SUB_CLK1. When the program setup sub-operation is completed, a first program sub-operation PGM11 may be performed. The clock selection signal output circuit 330 (of FIG. 3) may check when the program setup sub-operation VSET11 is completed, and the first or second main clock MC_CLK1 or MC_CLK2 may be generated according to the clock selection signal CLK_SEL output from the clock selection signal 330. Also in subsequent sub-operations, the main clock may be selected by the clock selection signal output circuit 330.

Since the threshold voltages of the selected memory cells increase in the first program sub-operation PCM11, the first program sub-operation PCM11 may have a high importance. Accordingly, in order to secure a sufficient operation time, the first program sub-operation PCM11 may operate according to the first main clock MC_CLK1 having a longer period than the second main clock MC_CLK2. When the first program sub-operation PCM11 is completed, a first latch sub-operation LAT11 may be performed. The first or second main clock MC_CLK1 or MC_CLK2 may be selectively generated according to the clock selection signal CLK_SEL output from the clock selection signal output circuit 330.

In the first latch sub-operation LAT11, latches included in the page buffers may be set up or word lines may be discharged. Since any operation influencing the threshold voltage of the memory cells is not performed in the first latch sub-operation LAT11, the first latch sub-operation LAT11 may have a relatively low importance than other sub-operations. Accordingly, the first latch sub-operation LAT11 may be operated according to the second main clock MC_CLK2. When the first latch sub-operation LAT11 is completed, a first verify sub-operation VER11 may be performed.

In the first verify sub-operation VER11, it may be determined whether the threshold voltages of the selected memory cells are higher than a target level. In the first verify sub-operation VER11, it may be determined whether the selected memory cells have been programmed properly during a program loop having been previously performed, and accordingly the first verify sub-operation VER11 may have a relatively high importance. Accordingly, in order to secure a sufficient operation time, the first verify sub-operation VER11 may operate according to the first main clock MC_CLK1 having a longer period than the second main clock MC_CLK2.

As a result of the first verify sub-operation VER11, when the verification has failed with respect to the previous program loop, a second latch sub-operation LAT12 may be performed, and then a second program sub-operation PGM12 may be performed. Although FIG. 6 illustrates only two program sub-operations (first and second program sub-operations PGM 11 and PGM12), it is just for convenience of explanation, and further sub-operations may be performed.

If all the sub-operations VSET21, PGM21, LAT21, VER21, LAT22, and PGM22 are performed using a constant main clock MC_CLK as in the related are, operation times thereof are not able to be flexibly adjusted.

In the present embodiment, however, since sub clocks SUB_CLK1 and SUB_CLK2 having various periods may be selectively used, the operation times may be flexibly adjusted. Although only two different sub clocks CUB_CLK1 and SUB_CLK2 are described here, three or more sub clocks may be used according to the memory device.

When it is assumed that the period of the main clock MC_CLK1 of the present embodiment is identical to the period of the main clock MC_CLK of the related art, the first program sub-operation PGM11 of the present embodiment, which uses the main clocks MC_CLK1, and the first program sub-operation PCM21 of the related art, which uses the main clocks MC_CLK, may be performed during the same time period T1 to T2.

On the other hand, since the first latch sub-operation LAT11 of the present embodiment is performed using the second main clock MC_CLK2 having a shorter period, the first latch sub-operation LAT11 may be performed during a time period T2 to T3 shorter than a time period T2 to T3' during which the first latch sub-operation LAT21 of the related art is performed.

In the present embodiment and the related art, the main clocks MC_CLK1 and MC_CLK have the same period as one another, and thus the first verify sub-operations VER11 and VER21 may be performed during the same time periods T3 to T4 and T3' to T4'.

As described above, also in the remaining second latch sub-operations LAT12 and LAR22, an operation time T4 to T5 of the present embodiment may be shorter than an operation time T4' to T5' of the related art, and the second program sub-operation PGM22 of the related art and the second program sub-operation PGM12 of the present embodiment may be performed during the same operation time T5' to T6' and T5 to T6.

In this way, an entire operation time may be shortened while maintaining the reliability of the memory device by using a clock having a short period in sub-operations having relatively low importances.

In addition, in the above-described embodiments, although two sub clocks and main clocks having different periods were described, three or more sub clocks with different periods may be generated and used by using three or more oscillators and three or more different main clocks may be generated and used by selectively using three or more sub clocks.

Figure 8:
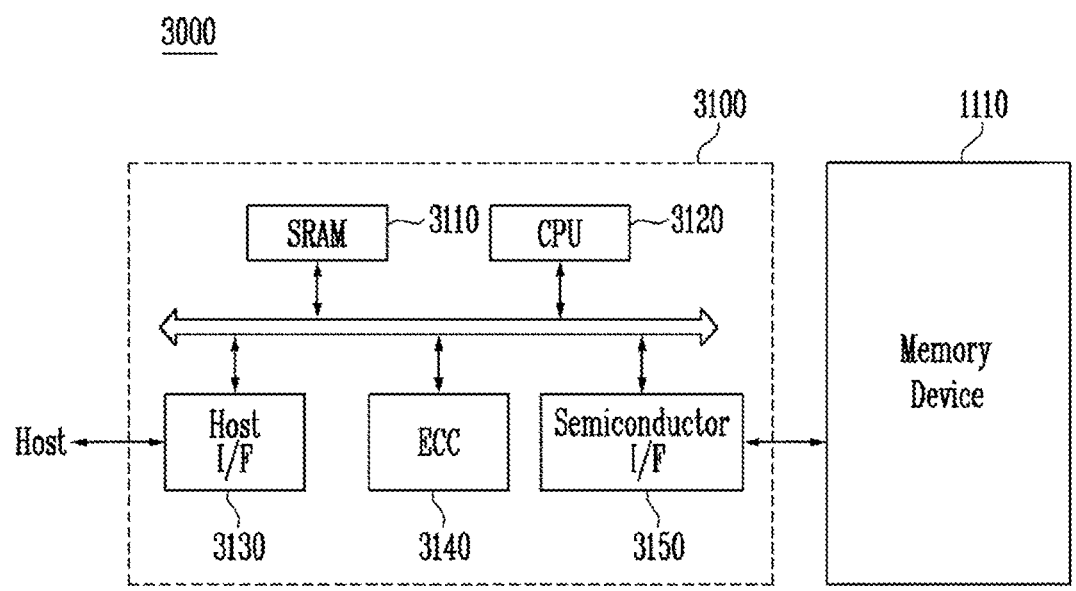
FIG. 8 is a diagram illustrating an example of a memory system according to an embodiment of the present disclosure.

FIG. 8 is a diagram illustrating an example of a memory system according to an embodiment of the present disclosure.

Referring to FIG. 8, since a memory device 1110 may be configured substantially identically to that of FIG. 2, a detailed description thereabout will be omitted.

A control circuit 3100 may control the memory device 1110. An SRAM 3110 may be used as a working memory of a CPU 3120. A host interface (I/F) 3130 may include a data exchange protocol of a host coupled to a memory system 3000. An error correcting circuit (ECC) 3140 included in the control circuit 3100 may detect and correct errors included in data read from the memory device 1110. A semiconductor I/F 3150 may interface with the memory device 1110. The CPU 3120 may perform control operations for data exchange of the control circuit 3100. In addition, although not illustrated in FIG. 8, the memory system 3000 may be further provided with a ROM (not illustrated) for storing code data for interfacing with the host.

The memory system 3000 in accordance with an embodiment of the present disclosure may be applied to one of a computer, mobile computer, ultra mobile PC (UMPC), workstation, net-book, PDA, portable computer, web tablet, wireless phone, mobile phone, smartphone, digital camera, digital audio recorder, digital audio player, digital picture recorder, digital picture player, digital video recorder, a digital video player, a device for transmitting/receiving information in a wireless environment, or various devices configuring a home network.

Figure 9:
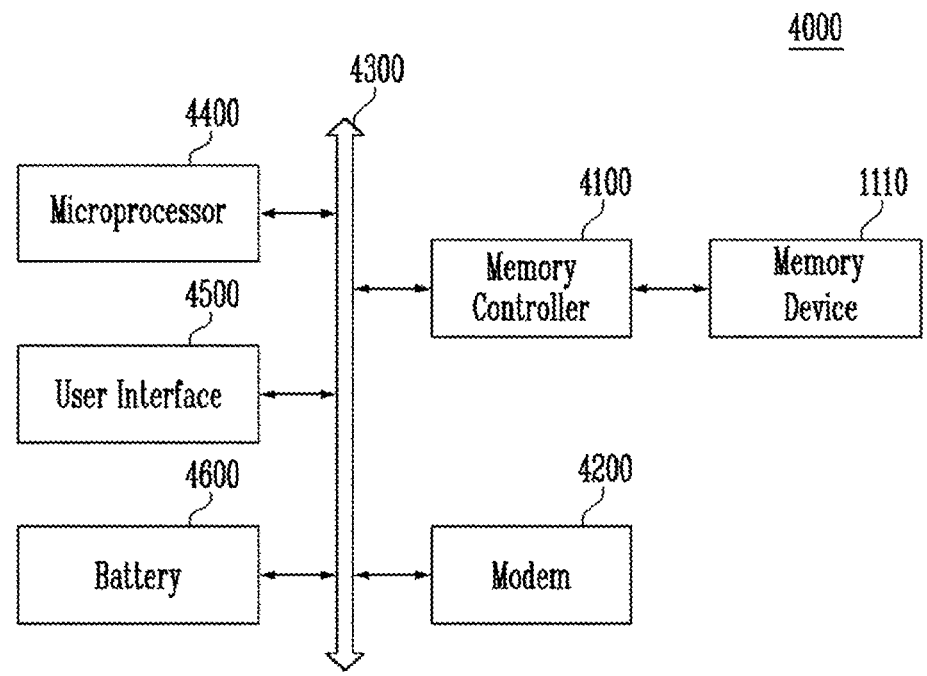
FIG. 9 is a diagram illustrating an example of a computing system including a memory device according to an embodiment of the present disclosure.

FIG. 9 is a diagram illustrating an example of a computing system including a memory device according to an embodiment of the present disclosure.

Referring to FIG. 9, a computing system 4000 according to an embodiment of the present disclosure may include a memory device 1110 electrically coupled to a bus 4300, a control circuit 4100, a modem 4200, a microprocessor 4400, and a user I/F 4500. When the computing system 4000 according to an embodiment of the present disclosure is a mobile device, a battery 4600 for supplying an operation voltage of the computing system 4000 may be additionally provided. Although not illustrated in the drawing, the computing system 4000 according to an embodiment of the present disclosure may further include an application chipset, a camera image processor (CIS), and a mobile DRAM, etc.

Since a memory device 1110 may be configured substantially identically to that of FIG. 2, a detailed description thereabout will be omitted.

The control circuit 4100 and the memory device 1110 may form a solid state drive/disk (SSD).

A system according to an embodiment of the present disclosure may be mounted using various types of packages. For example, the system according to an embodiment of the present disclosure may be mounted using packages such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

Various embodiments of the present disclosure may flexibly adjust an operation timing, and therefore an operation time may be shortened according to the importance of the operation. Accordingly, the operation time may be shortened while maintaining the reliability of the memory device.

The present disclosure has been described using various embodiments. However, it is to be understood that the scope of the present disclosure is not limited to the disclosed embodiments. In addition, those of ordinary skill in the art will recognize that various changes and modifications of the embodiments described herein can be made without departing from the scope and spirit of the present disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A control circuit comprising:
   a command interface configured to output a selection enable signal in response to a command;
   a clock selection signal output circuit configured to output, in response to the selection enable signal, a clock selection signal based on information of each of various sub-operations performed in a selected operation; and
   a clock generating circuit configured to generate main clocks having different periods according to the clock selection signal,
   wherein the selected operation is one of program, read and erasure operations on a memory block,
   wherein the information of each of the various sub-operations represents a degree of influence of each of the various sub-operations on a threshold voltage distribution of memory cells included in the memory block, and
   wherein as the degree of influence on the threshold voltage distribution increases, a main clock having a longer period is generated.

2. The control circuit according to claim 1, wherein the clock selection signal output circuit comprises a plurality of operation code storing circuits configured to store codes respectively corresponding to the various sub-operations and to output the clock selection signal in response to a code corresponding to a selected sub-operation from among the stored codes.

3. The control circuit according to claim 2, wherein an operation code storing circuit corresponding to an operation selected in response to the selection enable signal is selected from among the plurality of operation code storing circuits, and the clock selection signal is output according to a code corresponding to a selected period from among codes stored in the selected operation code storing circuit.

4. The control circuit according to claim 2, wherein the operation code storing circuits are distinguished from each other according to different operations.

5. The control circuit according to claim 4, wherein the plurality of operation code storing circuits comprise:
   a first operation code storing circuit corresponding to a program operation;
   a second operation code storing circuit corresponding to a read operation; and
   a third code storing circuit corresponding to an erasure operation.

6. The control circuit according to claim 5, wherein the first operation code storing circuit comprises:
   a first code corresponding to a program setup sub-operations;
   a second code corresponding to a program sub-operations;
   a third code corresponding to a latch sub-operations; and
   a fourth code corresponding to a verify sub-operations.

7. The control circuit according to claim 5, wherein the second operation code storing circuit comprises:
   a fifth code corresponding to a read setup sub-operations;
   a sixth code corresponding to a sensing sub-operations;
   a seventh code corresponding to an evaluation sub-operations; and
   an eighth code corresponding to an output sub-operations.

8. The control circuit according to claim 5, wherein the third operation code storing circuit comprises:
   a ninth code corresponding to an erasure setup sub-operations;
   a tenth code corresponding to an erasure sub-operations;

an eleventh code corresponding to a latch sub-operations; and a twelfth code corresponding to a verify sub-operations.

9. The control circuit according to claim 1, wherein the clock selection signal output circuit comprises a plurality of operation timers configured to store various pieces of time information respectively corresponding to the various sub-operations and to compare the time information with a measured time to output the clock selection signal.

10. The control circuit according to claim 9, wherein one of the plurality of operation timers is selected according to the selection enable signal.

11. The control circuit according to claim 1, wherein the clock generating circuit comprises:
   a plurality of oscillators configured to generate sub clocks having different periods;
   a plurality of inverting circuits configured to invert the sub clocks to generate inverted sub clocks; and
   a clock switch circuit configured to use the sub clocks and the inverted sub clocks to output the main clocks according to the clock selection signal.

12. The control circuit according to claim 11, wherein the clock switch circuit receives, as each clock pair, clocks having a same period, among the sub clocks and the inverted sub clocks.

13. The control circuit according to claim 1, further comprising a control signal output circuit configured to output a control signal for controlling peripheral circuits in response to an operation signal output from the command interface and the main clocks.

* * * * *

UNITED STATES PATENT AND TRADEMARK OFFICE
CERTIFICATE OF CORRECTION

PATENT NO. : 9,990,968 B2  
APPLICATION NO. : 15/290145  
DATED : June 5, 2018  
INVENTOR(S) : Beom Seok Hah Page 1 of 1

It is certified that error appears in the above-identified patent and that said Letters Patent is hereby corrected as shown below:

On the Title Page

Item (71) Applicant:
Replace "SK hynix Inc., Incheon-si, Gyeonggi-do (KR)" with --SK hynix Inc., Icheon-si, Gyeonggi-do (KR)--

Signed and Sealed this
Third Day of July, 2018

Andrei Iancu
*Director of the United States Patent and Trademark Office*